(12) United States Patent
Heng et al.

(10) Patent No.: US 8,400,780 B2
(45) Date of Patent: Mar. 19, 2013

(54) STACKED MICROFEATURE DEVICES

(75) Inventors: Mung Suan Heng, Singapore (SG); Kok Chua Tan, Singapore (SG); Vince Chan Seng Leong, Singapore (SG); Mark S. Johnson, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 173 days.

(21) Appl. No.: 12/820,704

(22) Filed: Jun. 22, 2010

(65) Prior Publication Data
US 2010/0258939 A1    Oct. 14, 2010

Related U.S. Application Data

(60) Division of application No. 11/416,740, filed on May 3, 2006, now Pat. No. 7,742,313, which is a continuation of application No. 10/651,912, filed on Aug. 29, 2003, now Pat. No. 7,071,421.

(51) Int. Cl.
*H05K 1/11* (2006.01)
*H05K 1/14* (2006.01)

(52) U.S. Cl. ......... 361/784; 361/764; 361/772; 361/790

(58) Field of Classification Search .................. 361/767, 361/770–774; 257/728–730, 777–780
See application file for complete search history.

(56) References Cited

U.S. PATENT DOCUMENTS

| | | |
|---|---|---|
| 5,128,831 A | 7/1992 | Fox, III et al. |
| 5,145,099 A | 9/1992 | Wood et al. |
| 5,252,857 A | 10/1993 | Kane et al. |
| 5,518,957 A | 5/1996 | Kim et al. |
| 5,677,566 A | 10/1997 | King et al. |
| 5,826,628 A | 10/1998 | Hamilton |
| 5,879,965 A | 3/1999 | Jiang et al. |
| 5,883,426 A | 3/1999 | Tokuno et al. |
| 5,925,930 A | 7/1999 | Farnworth et al. |
| 5,933,713 A | 8/1999 | Farnworth |
| 5,946,553 A | 8/1999 | Wood et al. |
| 5,986,209 A | 11/1999 | Tandy |
| 5,990,566 A | 11/1999 | Farnworth et al. |
| RE36,469 E | 12/1999 | Wood et al. |
| 6,020,624 A | 2/2000 | Wood et al. |
| 6,020,629 A | 2/2000 | Farnworth et al. |
| 6,028,365 A | 2/2000 | Akram et al. |
| 6,048,744 A | 4/2000 | Corisis et al. |
| 6,048,755 A | 4/2000 | Jiang et al. |
| 6,051,878 A | 4/2000 | Akram et al. |
| 6,072,233 A | 6/2000 | Corisis et al. |
| 6,072,236 A | 6/2000 | Akram et al. |
| 6,081,429 A | 6/2000 | Barrett |

(Continued)

OTHER PUBLICATIONS

Search Report and Written Opinion for Singapore Application No. 200305589-4, Australian Patent Office, Apr. 8, 2005.

*Primary Examiner* — Tuan T Dinh
(74) *Attorney, Agent, or Firm* — Perkins Coie LLP (57) ABSTRACT

Stacked microfeature devices and associated methods of manufacture are disclosed. A package in accordance with one embodiment includes first and second microfeature devices having corresponding first and second bond pad surfaces that face toward each other. First bond pads can be positioned at least proximate to the first bond pad surface and second bond pads can be positioned at least proximate to the second bond pad surface. A package connection site can provide electrical communication between the first microfeature device and components external to the package. A wirebond can be coupled between at least one of the first bond pads and the package connection site, and an electrically conductive link can be coupled between the first microfeature device and at least one of the second bond pads of the second microfeature device. Accordingly, the first microfeature device can form a portion of an electrical link to the second microfeature device.

6 Claims, 4 Drawing Sheets

U.S. PATENT DOCUMENTS

| | | | |
|---|---|---|---|
| 6,097,087 A | 8/2000 | Farnworth et al. |
| 6,103,547 A | 8/2000 | Corisis et al. |
| 6,107,122 A | 8/2000 | Wood et al. |
| 6,130,474 A | 10/2000 | Corisis |
| 6,133,068 A | 10/2000 | Kinsman |
| 6,133,622 A | 10/2000 | Corisis et al. |
| 6,148,509 A | 11/2000 | Schoenfeld et al. |
| 6,150,710 A | 11/2000 | Corisis |
| 6,153,924 A | 11/2000 | Kinsman |
| 6,159,764 A | 12/2000 | Kinsman et al. |
| 6,175,149 B1 | 1/2001 | Akram |
| 6,212,767 B1 | 4/2001 | Tandy |
| 6,225,689 B1 | 5/2001 | Moden et al. |
| 6,228,548 B1 | 5/2001 | King et al. |
| 6,229,202 B1 | 5/2001 | Corisis |
| 6,235,554 B1 | 5/2001 | Akram et al. |
| 6,239,489 B1 | 5/2001 | Jiang |
| 6,246,108 B1 | 6/2001 | Corisis et al. |
| 6,246,110 B1 | 6/2001 | Kinsman et al. |
| 6,258,623 B1 | 7/2001 | Moden et al. |
| 6,258,624 B1 | 7/2001 | Corisis |
| 6,261,865 B1 | 7/2001 | Akram |
| 6,271,580 B1 | 8/2001 | Corisis |
| 6,281,577 B1 | 8/2001 | Oppermann et al. |
| 6,284,571 B1 | 9/2001 | Corisis et al. |
| 6,291,894 B1 | 9/2001 | Farnworth et al. |
| 6,294,839 B1 | 9/2001 | Mess et al. |
| 6,297,547 B1 | 10/2001 | Akram |
| 6,303,981 B1 | 10/2001 | Moden |
| 6,303,985 B1 | 10/2001 | Larson et al. |
| 6,310,390 B1 | 10/2001 | Moden |
| 6,329,222 B1 | 12/2001 | Corisis et al. |
| 6,329,705 B1 | 12/2001 | Ahmad |
| 6,331,448 B1 | 12/2001 | Ahmad |
| 6,344,976 B1 | 2/2002 | Schoenfeld et al. |
| 6,413,797 B2 | 7/2002 | Oka et al. |
| 6,420,787 B1 | 7/2002 | Kobayashi et al. |
| 6,429,528 B1 | 8/2002 | King et al. |
| 6,522,015 B1 | 2/2003 | Glenn et al. |
| 6,548,376 B2 | 4/2003 | Jiang |
| 6,548,757 B1 | 4/2003 | Russell et al. |
| 6,552,910 B1 | 4/2003 | Moon et al. |
| 6,555,917 B1 | 4/2003 | Heo |
| 6,560,117 B2 | 5/2003 | Moon et al. |
| 6,607,937 B1 | 8/2003 | Corisis |
| 6,670,702 B2 | 12/2003 | Corisis et al. |
| 6,683,374 B2 * | 1/2004 | Goller et al. ............. 257/686 |
| 6,847,105 B2 | 1/2005 | Koopmans |
| 7,071,421 B2 | 7/2006 | Heng et al. |
| 7,332,372 B2 | 2/2008 | Derderian |
| 7,742,313 B2 | 6/2010 | Heng et al. |
| 2001/0000013 A1 | 3/2001 | Lin |
| 2002/0167079 A1 | 11/2002 | Pu et al. |
| 2003/0089998 A1 | 5/2003 | Chan et al. |
| 2003/0111716 A1 | 6/2003 | Ano |
| 2003/0160311 A1 | 8/2003 | Ismail et al. |

\* cited by examiner

STACKED MICROFEATURE DEVICES

CROSS-REFERENCE TO RELATED APPLICATIONS

This application is a divisional of U.S. application Ser. No. 11/416,740 filed May 3, 2006, now U.S. Pat. No. 7,742,313, which is a continuation of U.S. application Ser. No. 10/651,912 filed Aug. 29, 2003, now U.S. Pat. No. 7,071,421, both of which are incorporated herein by reference in their entirety.

TECHNICAL FIELD

The present invention is directed generally to stacked microfeature devices and methods for manufacturing such packages.

BACKGROUND

Figure 1:
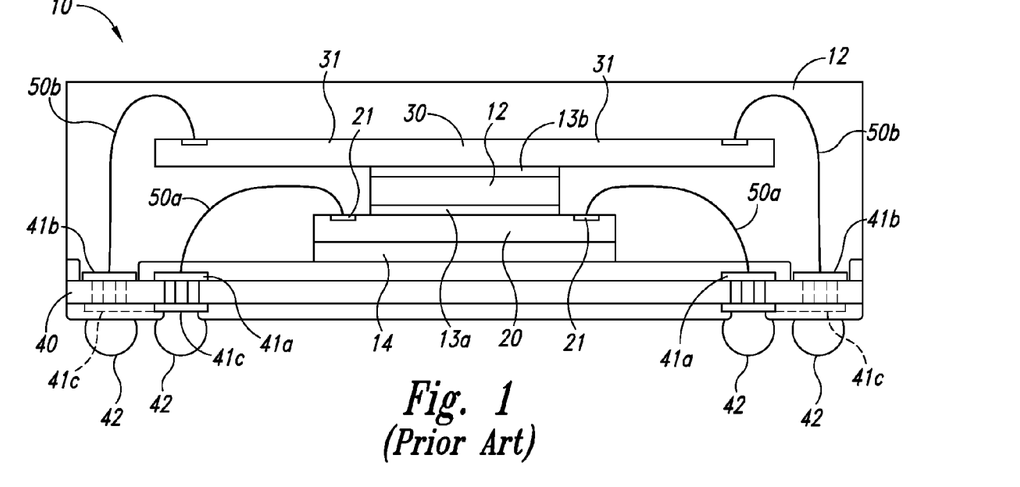
FIG. 1 is a partially schematic, cross-sectional elevation view of a package having stacked microelectronic dies in accordance with the prior art.

One method for increasing the density of microelectronic circuits for electronic devices (such as computers, portable phones, etc.) is to stack two or more microelectronic dies on top of each other. Accordingly, this arrangement can provide additional circuits within the same footprint normally occupied by a single die. FIG. 1 is a partially schematic, cross-sectional elevational view of an existing stacked die package 10. The package 10 includes a substrate 40 that carries a first die 20 and a stacked second die 30. The first die 20 is attached to the substrate 40 with a paste layer 14. A spacer 12 is attached to the first die 20 with a first tape layer 13a. The second die 30 is attached to the spacer 12 with a second tape layer 13b.

The first die 20 includes first die bond pads 21 that are coupled to corresponding first substrate bond pads 41a with first wirebonds 50a. The first substrate bond pads 41a are coupled to external substrate bond pads 41c with vias. The external substrate bond pads 41c each have a substrate solder ball 42 to provide communication between the first die 20 and devices located external to the package 10. Similarly, the second die 30 includes second die bond pads 31 coupled to corresponding second substrate bond pads 41b with second wirebonds 50b. The second substrate bond pads 41b are coupled to additional external substrate bond pads 41c to provide communication between the second die 30 and devices external to the package. Once the first and second wirebonds 50a, 50b are connected, the substrate 40, the first die 20, and the second die 30 can be at least partially enclosed with an encapsulant 12 to protect these components.

One feature of an arrangement shown in FIG. 1 is that the overall thickness of the package 10 can be significantly greater than the combined thicknesses of the substrate 40, the first die 20, and the second die 30. As a result, the package 10 can be difficult to integrate into devices having very tight vertical clearances. Accordingly, the benefits of the stacked die arrangement provided to the standard size devices in which they are incorporated may not be available for very compact devices.

DETAILED DESCRIPTION

A. Introduction

The present invention is directed to stacked microfeature devices and associated methods. The term "microfeature device" is used throughout to include a device formed from a substrate upon which and/or in which submicron circuits or components and/or data storage elements or layers are fabricated. Submicron features in the substrate include, but are not limited to, trenches, vias, lines, and holes. These features typically have a submicron width (e.g., ranging from, for example, 0.1 micron to 0.75 micron) generally transverse to a major surface (e.g., a front side or a back side) of the device. The term microfeature device is also used to include substrates upon which and/or in which micromechanical features are formed. Such features include read/write head features and other micromechanical features having submicron or supermicron dimensions. In many of these embodiments, the substrate is formed from suitable materials, including ceramics, and may support layers and/or other formations of other materials, including but not limited to metals, dielectric materials and photoresists.

A microfeature device package in accordance with one aspect of the invention can include a first microfeature device having a plurality of first bond pads at least proximate to a first bond pad surface, and a second microfeature device having a plurality of second bond pads at least proximate to a second bond pad surface. The second bond pad surface can face toward the first bond pad surface. A package connection site can be positioned to provide electrical communication between the first microfeature device and components external to the device package. A wirebond can be coupled between at least one of the first bond pads and the package connection site, and an electrically conductive link can be coupled between the first microfeature device and at least one of the second bond pads of the second microfeature device.

In a particular aspect of the invention, the wirebond is one of a plurality of wirebonds and all the wirebonds of the package are connected directly to the first microfeature device. In a further particular aspect of the invention, the first microfeature device includes an intermediate bond pad electrically coupled to the at least one first bond pad, and the electrically conductive link is connected between the intermediate bond pad and the at least one second bond pad of the second microfeature device. In yet another aspect of the invention, the first microfeature device includes an intermediate bond pad electrically isolated from the at least one first bond pad, and the electrically conductive link is connected between the intermediate bond pad and the at least one second bond pad of the second microfeature device.

The present invention is also directed towards methods for forming a microfeature device package. In one aspect of the invention, the method includes positioning a first microfeature device at least proximate to a second microfeature device, with the first microfeature device having a first bond pad surface with a plurality of first bond pads at least proximate to the first bond pad surface, and with the second microfeature device having a second bond pad surface with a plurality of second bond pads at least proximate to the second bond pad surface. The first bond pad surface can be positioned to face toward the second bond pad surface. A wire bond can be coupled between at least one of the first bond pads and a package connection site that is positioned to provide electrical communication between the first microfeature device and components external to the device package. An electrically conductive link can be coupled between the first microfeature device and at least one of the second bond pads of the second microfeature device.

In a particular aspect of the invention, the wire bond is one of a plurality of wire bonds and the method further includes connecting all the wire bonds of the package directly to the first microfeature device. In other aspects of the invention, the first microfeature device can include an intermediate bond pad electrically coupled to the at least one first bond pad, and coupling an electrically conductive link between the first microfeature device and the at least one second bond pad can include coupling the electrically conductive link between the intermediate bond pad and the at least one second bond pad. In yet another aspect of the invention, the intermediate bond pad is electrically isolated from the at least one first bond pad.

B. Methods and Apparatuses in Accordance with Embodiments of the Invention

Several specific details of the invention are set forth in the following description and in FIGS. 2-5 to provide a thorough understanding of certain embodiments of the invention. One skilled in the art, however, will understand that the present invention may have additional embodiments, and that other embodiments of the invention may be practiced without several of the specific features explained in the following description.

Figure 2:
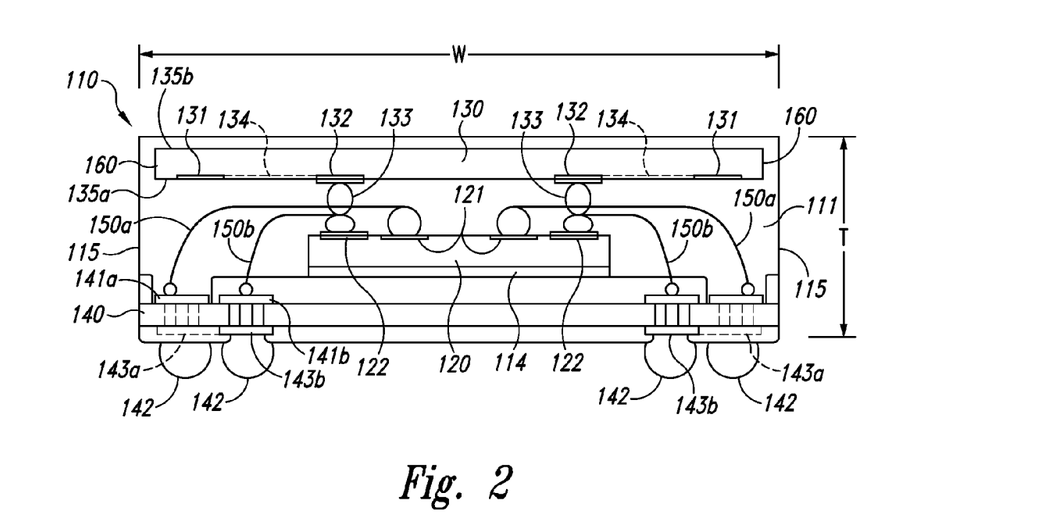
FIG. 2 is a partially schematic, cross-sectional elevation view of a package having dies stacked and coupled in accordance with an embodiment of the invention.

FIG. 2 is a partially schematic, cross-sectional illustration of a package 110 having a first microfeature device 120 and a second microfeature device 130 stacked in accordance with an embodiment of the invention. In one aspect of this embodiment, all the wirebonds within the package 110 can be attached directly to the first microfeature device 120, with some wirebonds communicating only with the first microfeature device 120, and with others communicating only with the second microfeature device 130, via additional electrical links positioned between the first microfeature device 120 and the second microfeature device 130. In another embodiment, at least some of the wirebonds can be coupled to both the first microfeature device 120 and the second microfeature device 130. In both embodiments, the first microfeature device 120 can provide a platform that supports electrical links coupled to the second microfeature device 130. As described in greater detail below, this arrangement can reduce the overall thickness of the package 110 by eliminating wirebonds connected directly to the second microfeature device 130.

In one aspect of an embodiment shown in FIG. 2, the package 110 includes a support member 140, for example, a printed circuit board. The support member 140 can carry the first and second devices 120, 130 and can provide for electrical communication between these devices, as well as devices or circuits external to the package 110. Accordingly, the support member 140 can have a plurality of package connection sites 143, shown in FIG. 2 as first package connection sites 143a and second package connection sites 143b offset forward of the first package connection sites 143a. Each of the package connection sites 143 can include a package connector 142 to provide for communication with elements external to the package 110. In one embodiment, the package connectors 142 include solder balls and in other embodiments, the package connectors 142 include other electrically conductive structures. In any of these embodiments, the first package connection sites 143a can be coupled to first support member bond pads 141a with a vias that extend through the support member 140. The second package connection sites 143b can be coupled to corresponding second support member bond pads 141b, also with vias that extend through the support member 140. The first support member bond pads 141a and the second support member bond pads 141b are connected to the first microfeature device 120 and the second microfeature device 130, respectively, as described in greater detail below.

In one aspect of an embodiment shown in FIG. 2, the first microfeature device 120 can be attached to the support member 140 with a paste layer 114. In other embodiments, the first microfeature device 120 can be attached to the support member 140 with other arrangements. In any of these embodiments, the first microfeature device 120 can include first device bond pads 121 that are electrically coupled to features located within the first microfeature device 120. The first device bond pads 121 can be connected to the first support member bond pads 141a with first wirebonds 150a. In a particular aspect of this embodiment, each of the first wirebonds 150a can be attached to a stud bump (e.g., a gold stud bump) or other feature located at the corresponding first device bond pad 121 to improve the physical and/or electrical characteristics of the connection between the wirebond 150a and the first device bond pad 121. In other embodiments, the first wirebond 150a can be attached directly to the first device bond pad 121. In still a further aspect of this embodiment, the first wirebond 150a can be attached first to the support member 140 and then to the first microfeature device 120, for example, to reduce the extent of the wirebond loop.

The first microfeature device 120 can also carry intermediate bond pads 122. In one aspect of this embodiment, some or all of the intermediate bond pads 122 are not electrically connected to features within the first microfeature device 120, but instead, provide an intermediate point in an electrical communication link between the second microfeature device 130 and the support member 140. In another embodiment, at least some of the intermediate bond pads 122 are electrically connected to corresponding first device bond pads 122 (e.g., via a redistribution layer) or directly to features within the first microfeature device 120. In another embodiment, the intermediate bond pads 122 can be connected to the second substrate bond pads 141b with second wirebonds 150b. As described in greater detail below, the second microfeature device 130 can also be electrically coupled to the intermediate bond pads 122 to complete the communication link between the second package connection sites 143b located at the support member 140, and the features within the second microfeature device 130.

The second microfeature device 130 can include second bond pads 131 that are electrically connected to features within the second microfeature device 130. In one aspect of an embodiment shown in FIG. 2, the second bond pads 131 may not be aligned directly above the intermediate bond pads 122 located on the first microfeature device 120. Accordingly, the second microfeature device 130 can include auxiliary bond pads 132 which are aligned with the intermediate bond pads 122. The auxiliary bond pads 132 can be connected to the second bond pads 131 with couplers 134. In one embodiment, the couplers 134 are part of a redistribution layer, and in other embodiments, the couplers 134 have other arrangements. In one aspect of an embodiment shown in FIG. 2, the coupling between the auxiliary bond pads 132 and the second bond pads 131 can be at the surface of the second microfeature device 130. In other embodiments, the connection between the bond pads 131, 132 can be located within the interior of the second microfeature device 130. In any of these embodiments, the auxiliary bond pad 132 can be connected to an electrically conductive member 133 that is aligned with a corresponding one of the intermediate bond pads 122 on the first microfeature device 120 below. In one embodiment, the electrically conductive member 133 includes a stud bump, (e.g., a gold stud bump, a copper stud bump or a solder bump) and in other embodiments, the electrically conductive member 133 includes other structures. In any of these embodiments, the electrically conductive member 133 can be physically and electrically bonded to the intermediate bond pad 122 and/or to the portion of the second wirebond 150b attached to the intermediate bond pad 122.

In a particular aspect of an embodiment shown in FIG. 2, the package 110 is subjected to ultrasonic energy and/or an elevated temperature to secure the connection between the auxiliary bond pad 132 and the intermediate bond pad 122. In other embodiments, other techniques are used to secure this connection. In any of these embodiments, the connection between the auxiliary bond pad 132 and the intermediate bond pad 122 can both physically secure the second microfeature device 130 to the first microfeature device 120, and can provide electrical communication between the second device bond pad 131 and the second package connection site 143b. Once this connection is complete, an optional encapsulant 111 can be disposed over the support member 140, the first microfeature device 120 and the second microfeature device 130 to protect these components. In one embodiment, the encapsulant 111 can include a no-sweep encapsulant, available from KNS of Willow Grove, Pa. In other embodiments, the encapsulant 111 can include other products.

One feature of an embodiment of the package 110 described above with reference to FIG. 2 is that the second wirebonds 150b need not extend around the outwardly facing edges 160 of the second microfeature device 130. Instead, the second wirebonds 150b attach to the intermediate bond pads 122 of the first microfeature device 120, with the electrically conductive member 133 providing the link to the second microfeature device 130. One advantage of this feature is that the overall thickness T of the package 110 can be reduced when compared with existing packages because the encapsulant 111 need not extend beyond the second microfeature device 130 by an amount necessary to envelope the second wirebond 150b. Instead, the second wirebond 150b is positioned between the first microfeature device 120 and the second microfeature device 130. Because the resulting package 110 is accordingly thinner than conventional structural die packages, it can more easily be installed in locations that require a low profile device.

Another advantage of the foregoing arrangement is that the encapsulant 111 need not envelop the entire second microfeature device 130. For example, if the second microfeature device 130 includes a first surface 135a and a second, oppositely facing surface 135b, the second surface 135b need not be covered with the encapsulant 111. As a result the rate at which heat is transferred from the second microfeature device 130 can be enhanced, due to the exposed second surface 135b.

Another feature of an embodiment of the package 110 described above with reference to FIG. 2 is that the package 110 can have package outer edges 115 that are located more closely to the device outer edges 160 of the second microfeature device 130 than are the outer edges of existing packages. In particular, because the second wirebonds 150b need not extend around the device outer edges 160, the package outer edges 115 can be flush with the device outer edges 160, or can extend only a short distance outwardly from the device outer edges 160. Accordingly, the overall width W of the package 110 can also be reduced when compared with existing packages and the package 110 can accordingly be more easily installed in locations having tight lateral space constraints.

Still another feature of an embodiment of the package 110 described above with reference to FIG. 2 is that all the wirebonds of the package 110 can be connected to the first microfeature device 120 and none connected to the second microfeature device 130. Accordingly, all the wirebonds of the package 110 can be connected in a single pass, e.g., the package 110 need not undergo two separate wirebonding procedures, one for the first microfeature device 120 and another for the second microfeature device 130. An advantage of this arrangement is that it can reduce the time and cost associated with producing the package 110.

In other embodiments, the package 110 can have other configurations. For example, the first and second microfeature devices 120, 130 can have generally similar shapes and configurations, with the second device bond pads 131 arranged in a mirror image of the first device bond pads 121. Signals dedicated to either the first or second microfeature device can be routed via arrangements generally similar to those described below with reference to FIG. 5. In still further embodiments, the package 110 can include more than two microfeature devices. For example, in one embodiment, third or third and fourth microfeature devices can be stacked on the second microfeature device 130, with separate wirebonds routed to the third microfeature device.

Figure 3:
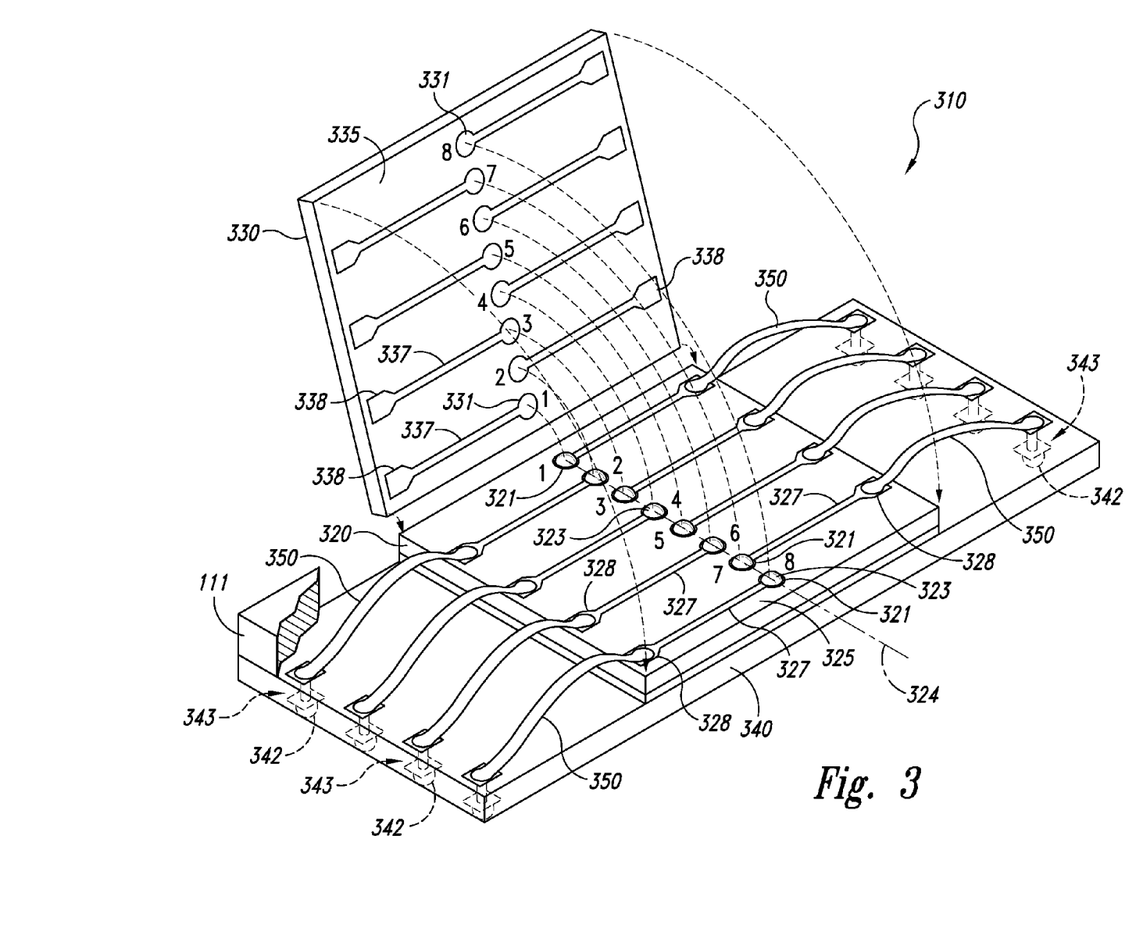
FIG. 3 is a partially schematic, partially exploded isometric view of two dies positioned to be stacked in accordance with another embodiment of the invention.

FIG. 3 is a partially exploded, partially schematic isometric illustration of a package 310 that includes a support member 340, a first microfeature device 320, and a stacked second microfeature device 330 arranged in accordance with another embodiment of the invention. In one aspect of this embodiment, the first microfeature device 320 has features arranged in exactly the same manner as the corresponding features of the second microfeature device 330. Accordingly, any microfeature device having this arrangement can be stacked upon any other microfeature device having the same arrangement. In other words, the microfeature device at the bottom of the stack need not have a different configuration than the microfeature device attached above.

In one aspect of an embodiment shown in FIG. 3, the first microfeature device 320 can have a first bond pad surface 325, with first device bond pads 321 positioned at least proximate to the first bond pad surface 325. For purposes of illustration, the first device bond pads 321 shown in FIG. 3 are labeled with numerals 1-8. Each first device bond pad 321 can be coupled to a first wirebond pad 328 with a corresponding first coupler 327. The first couplers 327 can include metal lines or other conductive structures located at or proximate to the first bond pad surface 325. In one aspect of this embodiment, the first device bond pads 321 are aligned with a device centerline 324 passing through the center of the first microfeature device 320. In other embodiments, the first device bond pads 321 can be located off the device centerline 324, as described in greater detail below with reference to FIG. 5.

As described above, the second microfeature device 330 can have features arranged generally similarly to those of the first microfeature device 320. Accordingly, the second microfeature device 330 can include a second bond pad surface 335, second device bond pads 331 (also labeled with numerals 1-8) at least proximate to the second bond pad surface 335, and second wirebond pads 338 coupled to the second device bond pads 331 with second couplers 337. The first and second microfeature devices 320, 330 can be stacked in a face-to-face arrangement on the support member 340, as described in greater detail below.

In one aspect of an embodiment shown in FIG. 3, the support member 340 includes package connection sites 343, for example, bond pads that are accessible from the outside of the package 310. Package connectors 342 (e.g., solder balls or other electrically conductive elements) can be coupled to the package connection sites 343 to provide for electrical communication with components outside the package 310. The package connection sites 343 can be electrically coupled to the first wirebond pads 328 with wirebonds 350. Accordingly, the wirebonds 350 can transmit signals between the package connection sites 343 and the first bond pads 321.

In a particular aspect of an embodiment shown in FIG. 3, signals transmitted to and from the first device bond pads 321 of the first microfeature device 320 are also transmitted to and from the corresponding second device bond pads 331 of the second microfeature device 330. Accordingly, when the second microfeature device 330 is stacked face down on top of the first microfeature device 320, each of the numbered second bond pads 331 aligns with the same correspondingly numbered first bond pad 321 of the first microfeature device 320. The second device bond pads 331 can be electrically connected to the corresponding first device bond pads 321 with electrically conductive members 323, initially disposed on the first bond pads 321. In one embodiment, the electrically conductive members 323 include solder balls, and in other embodiments, the electrically conductive members 323 include other structures. In any of these embodiments, the entire assembly can then be encapsulated with an encapsulant 111 (a small portion of which is shown in FIG. 3) in a manner generally similar to that shown in FIG. 2.

Figure 4:
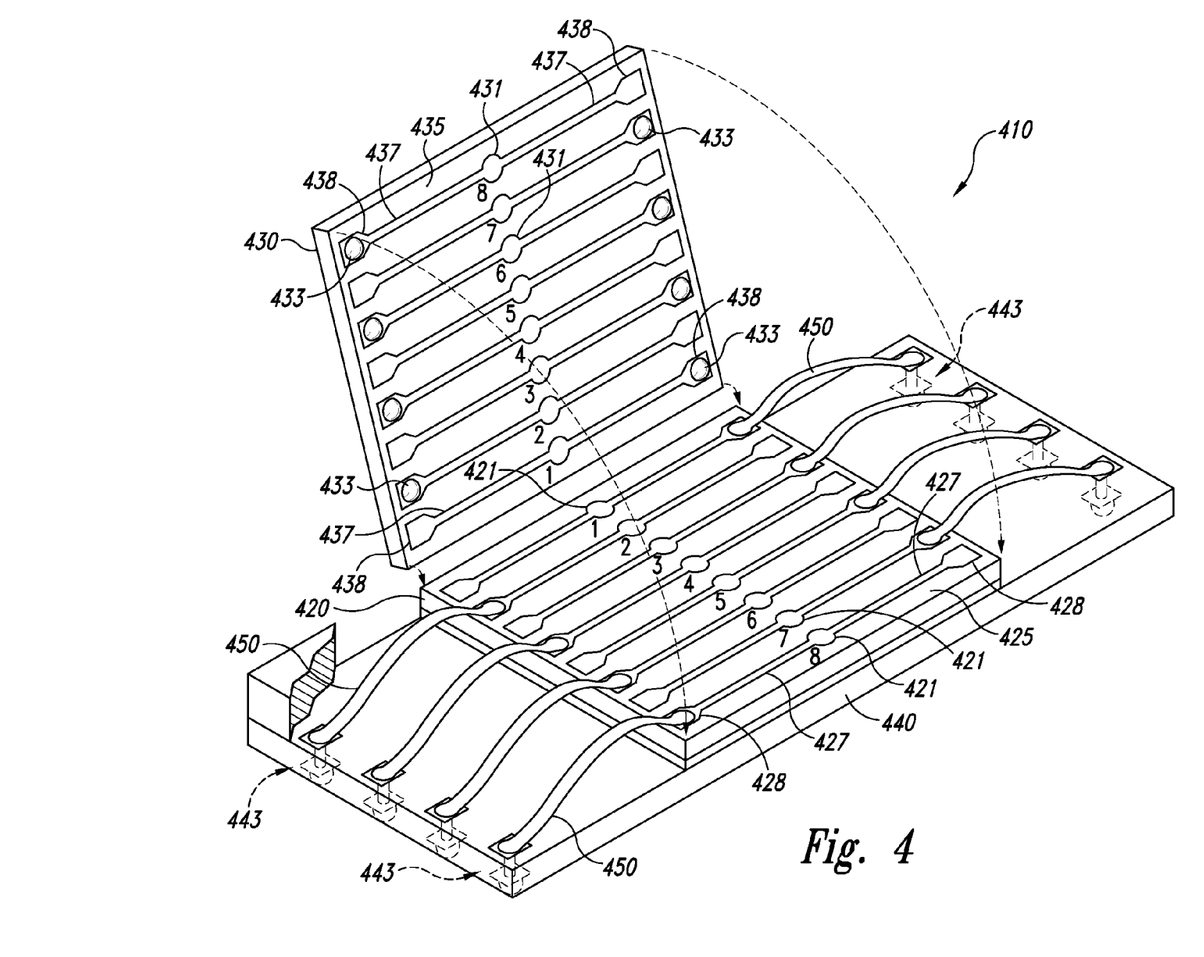
FIG. 4 is a partially schematic, partially exploded view of two dies positioned to be stacked in accordance with yet another embodiment of the invention.

FIG. 4 illustrates a partially exploded isometric view of a package 410 configured in accordance with another embodiment to the invention. In one aspect of this embodiment, the package 410 includes first and second microfeature devices 420, 430 having at least generally similar layouts, stacked face-to-face on a support member 440. Accordingly, the first microfeature device 420 can include a first bond pad surface 425 on or near which are positioned first bond device pads 421 (labeled with numerals 1-8) coupled to first wirebond pads 428 with first couplers 427. In one aspect of this embodiment, each first device bond pad 421 is coupled to a pair of first wirebond pads 428 with a coupler 427 that extends laterally to the left and right of the centrally positioned first device bond pad 421. Wirebonds 450 connect the wirebond pads 428 to package connection sites 443. In one aspect of this embodiment, half the wirebonds 450 connect to the first wirebond pads 428 located to the right of the first bond pads 421, and half connect to the first wirebond pads 428 located to the left of the first bond pads 421. In other embodiments, the wirebonds 450 are distributed in other manners.

Microfeature devices having the foregoing arrangement can be positioned on the bottom of the stack (e.g., in the position of the first microfeature device 420) or, by rotating the microfeature device and placing it face down, on the top of the stack (e.g., in the position of the second microfeature device 430). The second microfeature device 430 includes a second bond pad surface 435 that carries second device bond pads 431 electrically coupled to second wirebond pads 438 with second couplers 437. Those second wirebond pads 438 that are aligned with the wirebonds 450 below can include electrically conductive members 433 (e.g., solder balls) that physically couple the second microfeature device 430 to the first microfeature device 420, and electrically couple the second device bond pads 431 to the corresponding first device bond pads 421. Accordingly, signals transmitted to and/or received by the first device bond pads 421 are also transmitted to and/or received by the second bond pads 431.

Figure 5:
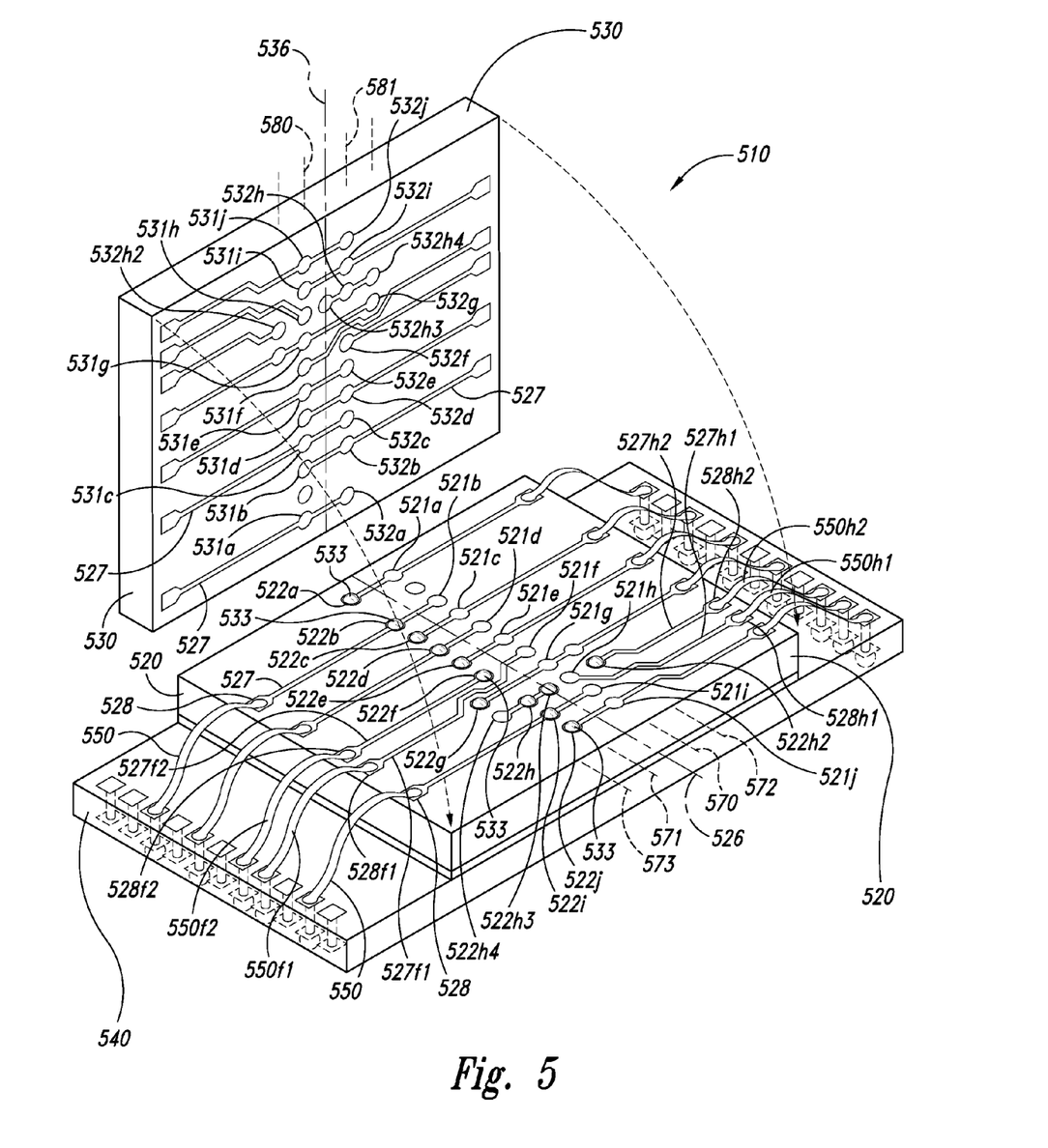
FIG. 5 is a partially schematic, partially exploded view of two dies having off-center bond pads and being positioned to be stacked in accordance with still another embodiment to the invention.

FIG. 5 is a partially exploded, isometric view of a package 510 configured to provide communication links to a first microfeature device 520 and separate communication links to a stacked second microfeature device 530. In one aspect of this embodiment, the first microfeature device 520 includes ten active first device bond pads 521 (shown as first device bond pads 521a-521j) positioned along a first axis 570 that is offset from a centerline 526 of the first microfeature device 520. The first microfeature device 520 can also include corresponding first intermediate bond pads 522 (shown as first intermediate bond pads 522a, 522c-522j) that are aligned (with the exception of first intermediate bond pad 522g) along a second axis 571. The second axis 571 is mirrored relative to the first axis 570 about the centerline 526. The first device bond pads 521 can be connected to first wirebond pads 528 with couplers 527. Wirebonds 550 can electrically couple the first wirebond pads 528 (and therefore, the first bond pads 521) to a support member 540.

The second microfeature device 530 can have a layout identical to that of the first microfeature device 520, with ten active second device bond pads 531a-531j aligned along a first axis 580, and corresponding second intermediate bond pads 532a-532j generally aligned along a second axis 581. The first axis 580 and the second axis 581 can be equidistant from a centerline 536 of the second microfeature device 530. Accordingly, when the second microfeature device 530 is positioned above the first microfeature device 520, it is rotated so that the second device bond pads 531 align with the correspondingly numbered first intermediate bond pads 522, and the second intermediate bond pads 532 align with the correspondingly numbered first device bond pads 521.

Some signals transmitted to/from the package 510 are shared by the first microfeature device 520 and the second microfeature device 530 and are accordingly transmitted via both the first device bond pads 521 and the correspondingly numbered second device bond pads 531. For example, signals transmitted via the first device bond pads 521a-e, i and j are also transmitted via the corresponding second device bond pads 531a-e, i and j, respectively. Accordingly, the couplers 527 for these bond pads connect these bond pads to the correspondingly numbered intermediate bond pads 522, 532 mirrored across the device centerlines 526, 536. Electrically conductive members 533 (e.g., solder balls) disposed on the first intermediate bond pads 522 electrically connect the first bond pads 521 of the first microfeature device 520 to the corresponding second bond pads 531 of the second microfeature device 530. For example, signals transmitted to/from the first device bond pad 521a are also transmitted to/from the second device bond pad 531a via an electrically conductive member 533 disposed between the first intermediate bond pad 522a and the second device bond pad 531a.

Other signals transmitted to/from the package 510 are transmitted to/from only the first microfeature device 520 and/or only the second microfeature device 530. For example, signals transmitted via the first device bond pads 521f and 521h of the first microfeature device 520 are independent of signals transmitted via the second device bond pads 531f and 531h of the second microfeature device 530. Accordingly, the first device bond pad 521f is not electrically coupled to its corresponding first intermediate bond pad 522f, but instead has an independent coupler 527/1 connected to a wirebond 550/1 at a first wirebond pad 528/1. The first intermediate bond pad 522f has a separate coupler 527/2 connected at a corresponding first wirebond pad 528f2 to wirebond 550f2. An electrically conductive member 533 at the first intermediate bond pad 522f electrically couples the wirebond 550f2 to the second device bond pad 531f of the second microfeature device 530. Accordingly, signals transmitted via the first device bond pad 521f are transmitted independently of signals transmitted via the second device bond pad 531f.

A generally similar though more complex arrangement is used to transmit signals via the first bond pad 521h independently of signals transmitted via the second bond pad 531h. The first bond pad 521h is coupled with a coupler 527h1 to a corresponding wirebond pad 528h1 and a corresponding wirebond 550h1. Accordingly, signals travel to/from the first device bond pad 521h directly via the coupler 527h1 and the wirebond 550h1.

A separate and electrically isolated coupler 527h2 is connected between a first intermediate bond pad 522h2 and a wirebond pad 528h2, which is coupled to a wirebond 550h2. The first intermediate bond pad 522h2 is positioned on a third axis 572. Additional first intermediate bond pads 522h3, 522h and 522h4 are electrically connected to each other and are positioned on the centerline 526, the second axis 571, and a fourth axis 573, respectively. The fourth axis 573 mirrors the third axis 572 about the centerline 526. Electrically conductive members 533 are disposed on the intermediate bond pads 522h2, 522h3 and 522h. Corresponding second intermediate bond pads 532h2, 532h, 532h3 and 532h4 on the second microfeature device are positioned to route electrical signals between the second device bond pad 531h and the wirebond 550h2, as follows: When the second microfeature device 530 is positioned face down on the first microfeature device 520 and physically and electrically coupled to it, signals travel to/from the second device bond pad 531h along a path that includes the wirebond 550h2, the coupler 527h2, the first intermediate bond pad 522h2, then to the corresponding second intermediate bond pad 532h4 (of the second microfeature device 530), then to the second intermediate bond 532h3 (of the second microfeature device 530) then to the corresponding first intermediate bond pad 522h3 (of the first microfeature device 520) then to the first intermediate bond pad 522h and finally to the second bond pad 531h of the second microfeature device 530.

One feature of an arrangement of microfeature devices described above with reference to FIG. 5 is that signals can be transmitted to/from some or all of the bond pads 521 of the first microfeature device 520 independently of signals transmitted to/from the corresponding bond pads 531 of the second microfeature device 530. This feature can increase the versatility of the package 510 because some or all aspects of the microfeature devices 520, 530 can be independently controlled despite the fact that they are stacked in the same package 510.

Another feature of the microfeature devices 520, 530 described above with reference to FIG. 5 is that both the first microfeature device 520 and the second microfeature device 530 can have identical feature layouts. Accordingly, even though each microfeature device 520, 530 is configured to receive separate signals when combined in the package 510, the devices themselves need not be manufactured to different specifications. An advantage of this arrangement is that costs associated with manufacturing and/or inventorying separate microfeature devices suitable for stacked packaging can be avoided, reducing the overall cost of the package 510. Another advantage of this arrangement is that the likelihood for inadvertently connecting the microfeature devices in an incorrect manner can be reduced because the microfeature devices can have identical layouts.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

We claim:

1. A microfeature device package, comprising:
   a first die having first features that include first bond pads, first intermediate bond pads at a first bond pad surface, and first couplers, the first intermediate bond pads being spaced apart from and electrically coupled to the first bond pads via the first couplers;
   a second die having second features that are generally similar to the first features of the first die and that include second bond pads, second intermediate bond pads at a second bond pad surface, and second couplers, the second intermediate bond pads being spaced apart from and electrically coupled to the second bond pads via the second couplers, wherein the second die is stacked on top of the first die with the second bond pad surface facing toward the first bond pad surface and such that individual first couplers are positioned between individual second couplers in an alternating arrangement; and
   a volume of solder disposed between individual first and second intermediate bond pads.

2. The package of claim 1 wherein the volume of solder physically and electrically bonds the individual first and second intermediate bond pads.

3. The package of claim 1, further comprising:
   a package connection site; and
   a wirebond electrically coupling the package connection site to at least one of the first bond pads.

4. The package of claim 1 wherein individual first and second bond pads are electrically coupled via the volume of solder between the individual first and second intermediate bond pads.

5. The package of claim 1 wherein the volume of solder includes at least one of a gold stud bump, a copper stud bump, and a solder bump.

6. The package of claim 1 wherein the first intermediate bond pads are disposed generally along a center line of the first die, and wherein the second intermediate bond pads are disposed generally along a center line of the second die and aligned with the first intermediate bond pads.

* * * * *